(12) United States Patent
Kinemura

(10) Patent No.: US 12,109,588 B2
(45) Date of Patent: Oct. 8, 2024

(54) ELECTRONIC DEVICE AND TACTILE-SENSATION GENERATION DEVICE

(71) Applicant: Alps Alpine Co., Ltd., Tokyo (JP)

(72) Inventor: Kazuhiko Kinemura, Miyagi (JP)

(73) Assignee: Alps Alpine Co., Ltd. (JP)

( * ) Notice: Subject to any disclaimer, the term of this patent is extended or adjusted under 35 U.S.C. 154(b) by 69 days.

(21) Appl. No.: 18/072,059

(22) Filed: Nov. 30, 2022

(65) Prior Publication Data

US 2023/0241645 A1 Aug. 3, 2023

(30) Foreign Application Priority Data

Jan. 28, 2022 (JP) ................. 2022-011581

(51) Int. Cl.
*B06B 1/02* (2006.01)
*G08B 6/00* (2006.01)
*H03K 17/687* (2006.01)

(52) U.S. Cl.
CPC .............. *B06B 1/0215* (2013.01); *G08B 6/00* (2013.01); *H03K 17/687* (2013.01)

(58) Field of Classification Search
CPC ........... G08B 6/00; B06B 1/0215; G05F 3/08; H02N 2/06; H02N 2/067
See application file for complete search history.

(56) References Cited

U.S. PATENT DOCUMENTS

| 9,552,008 | B1 | 1/2017 | Shimamune | |
|---|---|---|---|---|
| 2004/0150379 | A1* | 8/2004 | Kanamori | H02M 3/155 323/282 |
| 2020/0059551 | A1* | 2/2020 | Kim | H05B 47/115 |
| 2021/0351336 | A1* | 11/2021 | Sato | H02M 7/537 |
| 2023/0213978 | A1* | 7/2023 | Kim | H04M 1/72448 455/566 |

FOREIGN PATENT DOCUMENTS

| JP | H02-158212 A | 6/1990 |
|---|---|---|
| JP | 2017-054253 A | 3/2017 |

* cited by examiner

*Primary Examiner* — Mirza F Alam
(74) *Attorney, Agent, or Firm* — Harness, Dickey & Pierce, P.L.C.

(57) ABSTRACT

An electronic device includes a load, a first switching element, a drive circuit, and a second switching element. The first switching element is disposed on a current path connected to the load. The drive circuit drives the first switching element by using a drive control signal which is based on a comparison result between a load signal and a reference signal. The load signal is obtained by converting, into a voltage, a current flowing through the current path. The reference signal serves as a reference of an operation of the first switching element. The second switching element is capable of switching the signal level of the drive control signal between a first level, at which the first switching element is switched off, and a second level, at which the first switching element is switched on.

5 Claims, 5 Drawing Sheets

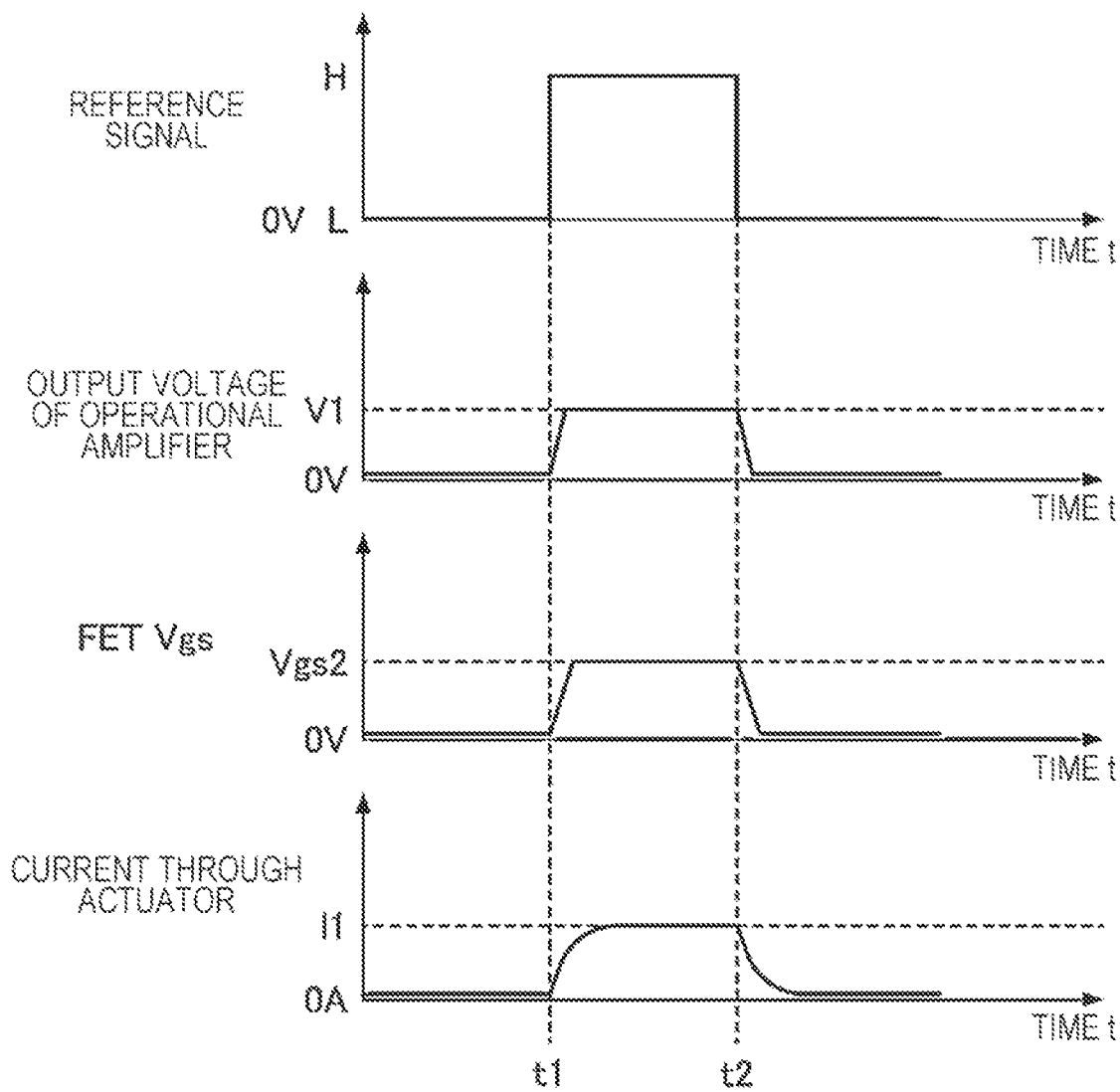

ELECTRONIC DEVICE AND TACTILE-SENSATION GENERATION DEVICE

CLAIM OF PRIORITY

This application claims benefit of Japanese Patent Application No. 2022-011581 filed on Jan. 28, 2022, which is hereby incorporated by reference in its entirety.

BACKGROUND OF THE INVENTION

1. Field of the Invention

The present disclosure relates to an electronic device and a tactile-sensation generation device.

2. Description of the Related Art

In the related art, there is a voltage regulator circuit (for example, see Japanese Unexamined Patent Application Publication No. 2017-054253) including an output transistor, an operational amplifier, an initiation circuit, and a current output circuit. The output transistor, which has first to third electrodes, controls the output voltage by flowing an output current between the first and second electrodes in accordance with a first differential voltage which is a difference between the first voltage of the first electrode and the second voltage of the third electrode. The operational amplifier controls the second voltage so that the output voltage reaches the target level. Before initiation of the voltage regulator circuit, the initiation circuit maintains the second voltage at a third voltage so that the output transistor is off. After initiation of the voltage regulator circuit, the initiation circuit allows the second voltage to be controlled by the operational amplifier. When the output voltage is less than a predetermined level, the current output circuit outputs an adjustment current from the third electrode or to the third electrode so that the first differential voltage increases.

In the voltage regulator circuit of the related art, the initiation circuit and the current output circuit are connected in series between the third voltage (Vdd) and the output terminal (Vout). Control is exerted so that the initiation circuit and the current output circuit are neither switched on nor switched off simultaneously, preventing a through current from flowing. Therefore, it takes time to determine the on/off states of the initiation circuit and the current output circuit, resulting in difficulty in obtaining sufficient responsiveness.

SUMMARY OF THE INVENTION

Accordingly, the present invention provides an electronic device and a tactile-sensation generation device having good responsiveness.

An electronic device according to an embodiment of the present disclosure includes a load, a first switching element, a drive circuit, and a second switching element. The first switching element is disposed on a current path connected to the load. The drive circuit drives the first switching element by using a drive control signal which is based on a comparison result between a load signal and a reference signal. The load signal is obtained by converting, into a voltage, a current flowing through the current path. The reference signal serves as a reference of an operation of the first switching element. The second switching element is capable of switching the signal level of the drive control signal between a first level, at which the first switching element is switched off, and a second level, at which the first switching element is switched on.

A tactile-sensation generation device according to an embodiment of the present disclosure includes an actuator, a first switching element, a drive circuit, and a second switching element. The actuator generates a vibration. The first switching element is disposed on a current path connected to the actuator. The drive circuit drives the first switching element by using a drive control signal which is based on a comparison result between a load signal and a reference signal. The load signal is obtained by converting, into a voltage, a current flowing through the current path. The reference signal serves as a reference of an operation of the first switching element. The second switching element is capable of switching the signal level of the drive control signal between a first level, at which the first switching element is switched off, and a second level, at which the first switching element is switched on. When the second switching element is switched off and the signal level of the drive control signal reaches the second level from the state in which the second switching element is switched on and the signal level of the drive control signal is at the first level, a rush current of the drive control signal is supplied to the control terminal of the first switching element from the drive circuit.

BRIEF DESCRIPTION OF THE DRAWINGS

FIG. 7 is a diagram illustrating operations in the drive control circuit for comparison.

DESCRIPTION OF THE PREFERRED EMBODIMENTS

An embodiment in application of an electronic device and a tactile-sensation generation device according to the present disclosure will be described below. Description will be made below by defining the XYZ coordinates system. For convenience of description, the −Z direction side is referred to as the lower side or the bottom; the +Z direction side is referred to as the upper side or the top. However, this does not indicate a universal vertical relationship. In addition, viewed toward the XY plane is referred to as viewed in plan.

Embodiment

The Configuration and Operations of an Input Device 100

Figure 1:
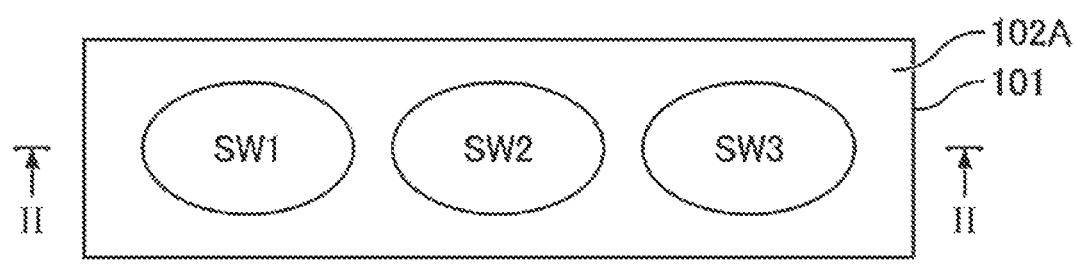
FIG. 1 is a plan view of an input device according to an embodiment.
Figure 1:
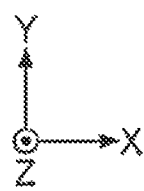
Figure 2:
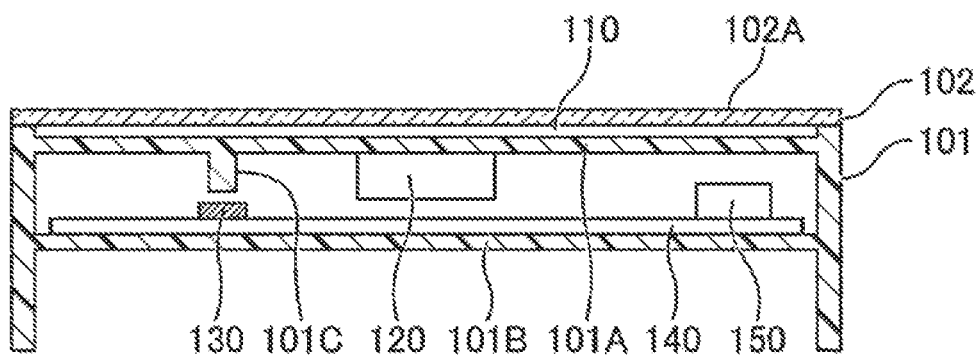
FIG. 2 is a cross-sectional view along II-II in FIG. 1.
Figure 2:
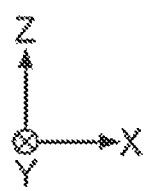
Figure 3:
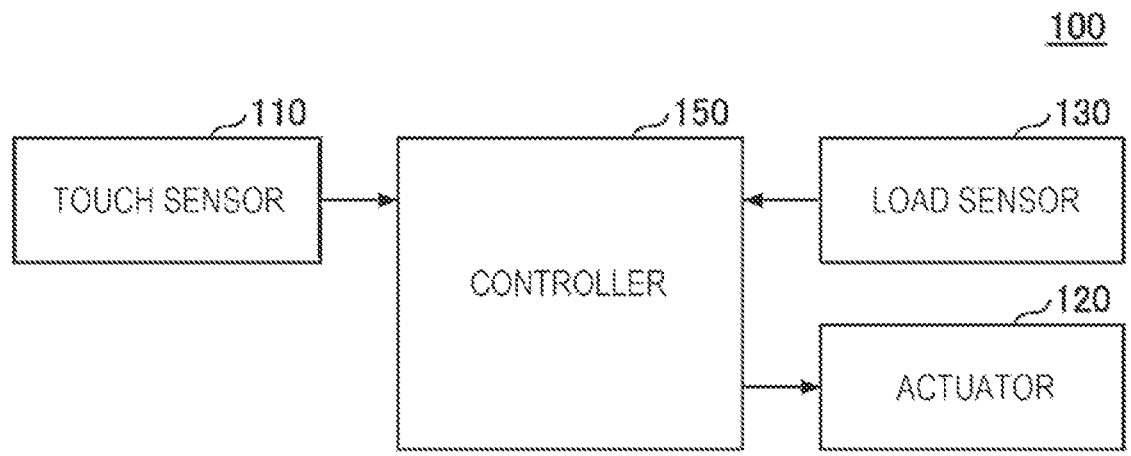
FIG. 3 is a block diagram illustrating the configuration of the input device.

FIG. 1 is a plan view of an input device 100 according to the embodiment. FIG. 2 is a cross-sectional view along II-II in FIG. 1. FIG. 3 is a block diagram illustrating the configuration of the input device 100.

The input device 100 is a device for receiving an operation performed, for example, by using a user's fingertip. The input device 100 may be included, for example, in a remote controller terminal, a smartphone, or the like which remotely operates an operation target device performing a function in accordance with the operation. Alternatively, the input device 100 may be integral with an operation unit of the operation target device. The input device 100 includes the electronic device and the tactile-sensation generation device according to the embodiment.

The tactile-sensation generation device according to the embodiment is a device which, in response to an operation on the input device 100 with a user's fingertip or the like, drives an actuator 120 (an exemplary load), which is described below, to vibrate for generation of a tactile sensation provided to the user's fingertip or the like. The tactile-sensation generation device according to the embodiment is a concrete example of the electronic device according to the embodiment. The electronic device according to the embodiment includes a load; the tactile-sensation generation device includes the actuator 120 as a load.

As a concrete example of the electronic device according to the embodiment, the tactile-sensation generation device including the actuator 120 will be described. The load included in the electronic device according to the embodiment may be a load other than the actuator 120 (for example, a light emitting diode (LED), a heater, or the like). That is, the load included in the electronic device according to the embodiment may be an LED, a heater, or the like. A form in which a user operates the input device 100 with their fingertip will be described. Alternatively, the operation may be performed by using a site of the user's body other than their fingertip.

The input device 100 includes a case 101, a top panel 102, a touch sensor 110, the actuator 120, a load sensor 130, a circuit board 140, and a controller 150. As illustrated in FIG. 3, the touch sensor 110, the actuator 120, and the load sensor 130 among these are connected to the controller 150. The touch sensor 110, the actuator 120, and the load sensor 130 are connected to the controller 150 through the circuit board 140. In FIG. 3, the circuit board 140 is not illustrated.

As illustrated in FIG. 2, the case 101, which is made of resin, has an upper panel 101A, a lower panel 101B, and a protrusion 101C. The plate-like upper panel 101A and the plate-like lower panel 101B form a structure of two top and bottom stages. When the upper panel 101A is pressed downward from the top surface side, the upper panel 101A may be distorted with respect to the lower panel 101B.

The touch sensor 110 and the top panel 102 are stacked on the top surface of the upper panel 101A in this sequence. On the bottom surface of the upper panel 101A, the actuator 120 is attached, and the protrusion 101C, which protrudes downward, is formed.

The circuit board 140 is disposed on the top surface of the lower panel 101B. The load sensor 130 is disposed in a portion, which is below the protrusion 101C, of the top surface of the circuit board 140. The controller 150 is disposed on the top surface of the circuit board 140.

The top surface of the top panel 102 is an operation surface 102A. As illustrated in FIG. 1, for example, three switches SW1, SW2, and SW3 are disposed on the operation surface 102A. The switches SW1, SW2, and SW3 are, for example, switches obtained by providing the operation surface 102A of the top panel 102 with symbols representing the operation targets of the switches SW1, SW2, and SW3. For example, the symbols of the switches SW1, SW2, and SW3 may be displayed through printing or the like on the operation surface 102A. A symbol is, for example, a character, a numeral, a sign, a line drawing, a mark, or the like which has predetermined meaning. In this example, the symbols represent the functions, the types, or the like of the switches SW1, SW2, and SW3.

The symbols of the switches SW1, SW2, and SW3 may be light-emitting units that are provided with transparent portions which have the shapes of the symbols and which are disposed through the light-blocking top panel 102 and that light by emitting light with an LED or the like from the bottom surface side of the top panel 102. Alternatively, the symbols of the switches SW1, SW2, and SW3 may be a graphical user interface (GUI) displayed on the display panel disposed under the transparent top panel 102. As the display panel, for example, a liquid-crystal panel, an organic light emitting diode (OLED) display panel, or the like may be used.

The touch sensor 110 is a device which is disposed under the top panel 102 and which detects the position of a user's fingertip or the like which comes in contact with (touches) the top panel 102. As the touch sensor 110, for example, a capacitive sensor which detects a change of the capacitance due to an approach of a user's fingertip or the like may be used. For example, the touch sensor 110 is a sensor, which has three electrodes corresponding to the switches SW1, SW2, and SW3 and which detects touches of the switches SW1, SW2, and SW3, a sensor, which has multiple electrodes extending in the X direction and the Y direction and which detects operations on the switches SW1, SW2, and SW3 through detection of the XY coordinates, or the like.

The actuator 120 is attached to the bottom surface of the upper panel 101A of the case 101. In response to the touch sensor 110's detection of an operation using a fingertip, the actuator 120 is driven by the controller 150 to generate vibrations. The actuator 120 is, for example, a piezoelectric device, an eccentric motor, a solenoid, a linear resonant actuator (LRA), or the like.

When any of the switches SW1, SW2, and SW3 on the top panel 102 is operated to be distorted downward, the load sensor 130 is pressed by the protrusion 101C. The load sensor 130 outputs, to the controller 150, an output signal indicating the magnitude of the load caused by the pressing. Instead of the load sensor 130, a pressure sensor (strain sensor), an electrostatic sensor which detects a change of the capacitance, an optical sensor which detects the distance from the protrusion 101C, or the like may be used. Alternatively, multiple load sensors 130 and protrusions 101C may be disposed at corresponding different positions in the XY coordinates.

The circuit board 140 is disposed on the top surface of the lower panel 101B of the case 101. As illustrated in FIG. 3, the circuit board 140 includes wiring, circuit elements, and the like which connect the touch sensor 110, the actuator 120, and the load sensor 130 to the controller 150. A drive control circuit which drives the actuator 120 by using a control signal, which is output by the controller 150, will be described below by using FIG. 4.

For example, the controller 150 is implemented by using a microcontroller implemented by using a computer including a central processing unit (CPU), a random access memory (RAM), a read only memory (ROM), a hard disk drive (HDD), an input/output interface, an internal bus, and the like.

In the case where the touch sensor 110 detects an operation on any of the switches SW1, SW2, and SW3, and where the load sensor 130 detects a pressing operation, the controller 150 drives the actuator 120. As a result, a tactile sensation is provided to a user's fingertip which comes in contact with any of the switches SW1, SW2, and SW3.

For example, when a fingertip touches any of the switches SW1, SW2, and SW3, and a pressing operation is performed, the operation on the switch (any of SW1 to SW3), which is being touched by the fingertip, is confirmed. More specifically, when a fingertip comes in contact with a portion of a switch SW1, SW2, or SW3 on the top panel 102, the touch sensor 110 detects the contact with any of the switches SW1, SW2, and SW3. When a pressing operation is further performed, the load sensor 130 detects the pressing operation. As a result, the controller 150 drives the actuator 120. Driving of the actuator 120 causes a tactile sensation to be provided to the fingertip. Thus, the user perceives confirmation of the operation. The controller 150 notifies the operation target device of a signal indicating the operation on any of the switches SW1, SW2, and SW3. Thus, the operation target device performs a function in accordance with the operation on any of the switches SW1, SW2, and SW3.

The Configuration of the Tactile-Sensation Generation Device 100A

Figure 4:
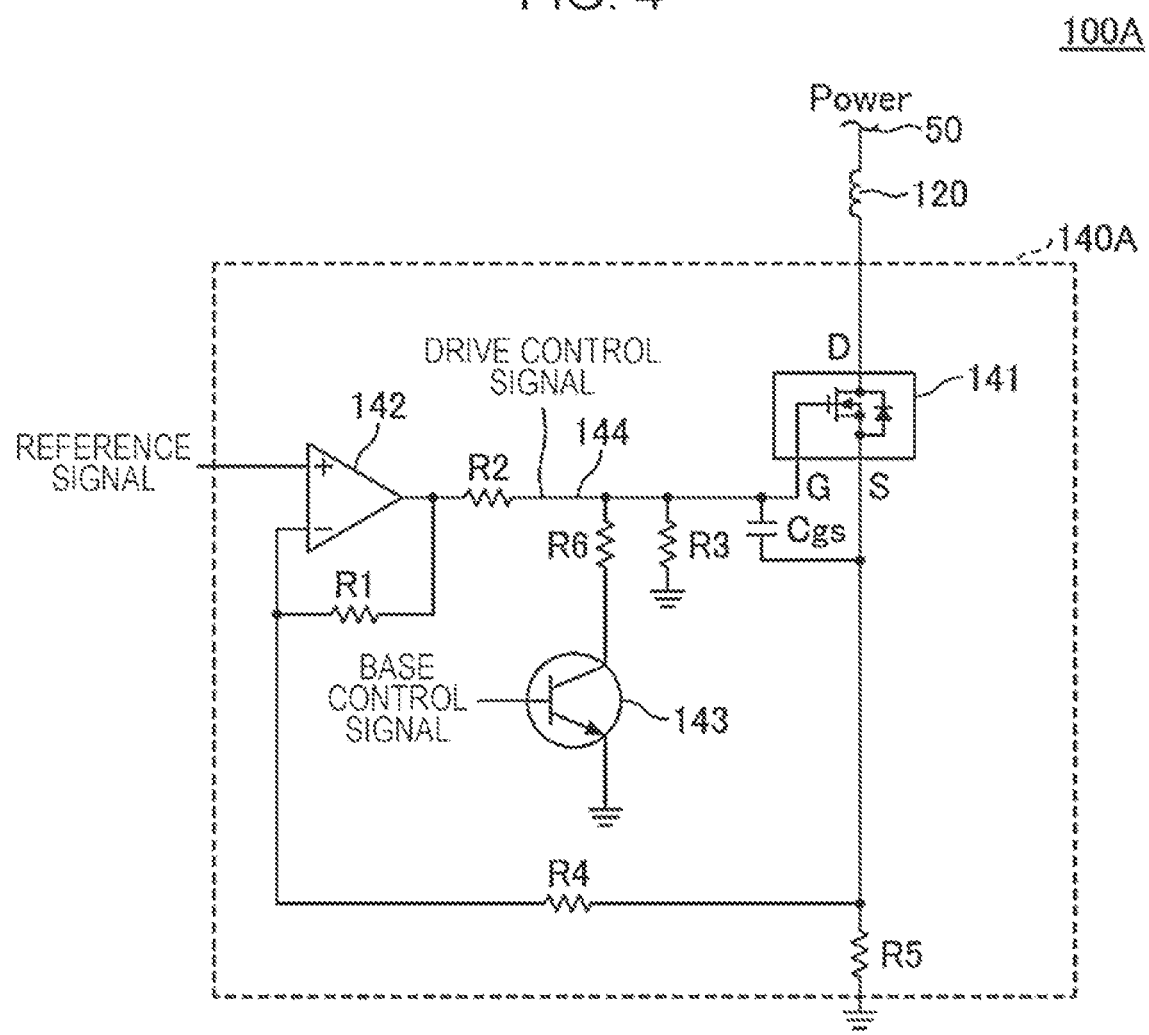
FIG. 4 is a diagram illustrating a tactile-sensation generation device.

FIG. 4 is a diagram illustrating a tactile-sensation generation device 100A. The tactile-sensation generation device 100A includes the actuator 120 and a drive control circuit 140A. The tactile-sensation generation device 100A may include the controller 150 (see FIGS. 2 and 3) in addition to the actuator 120 and the drive control circuit 140A. In this example, the form in which the tactile-sensation generation device 100A includes the actuator 120 and the drive control circuit 140A will be described.

The drive control circuit 140A, which is included in the circuit board 140 (see FIG. 2), includes wiring, circuit elements, and the like for driving the actuator 120 in accordance with a reference signal and a base control signal which are output from the controller 150.

The Configuration of the Drive Control Circuit 140A

As illustrated in FIG. 4, the drive control circuit 140A includes a field effect transistor (FET) 141, an operational amplifier 142, a transistor 143, a signal transmission path 144, and resistors R1 to R6. FIG. 4 also illustrates a power supply terminal 50. The voltage applied to the power supply terminal 50 is higher than the rated voltage at which the operational amplifier 142 and the controller 150 are operated. The FET 141 is an exemplary first switching element. The operational amplifier 142 is an exemplary drive circuit. The transistor 143 is an exemplary second switching element.

The actuator 120 has been inserted in series to the wire connected to the power supply terminal 50 which outputs direct-current power. The wire connected to the power supply terminal 50 is connected to the drain terminal (D) of the FET 141.

The FET 141 has the drain terminal (D), a source terminal (S), and a gate terminal (G). The gate terminal is an exemplary control terminal of the FET 141. FIG. 4 illustrates a parasitic capacitance Cgs between the gate terminal and the source terminal of the FET 141. The drain terminal is connected to the actuator 120. The source terminal is connected to the inverting input terminal of the operational amplifier 142 through the resistor R4, and is grounded through the resistor R5. The path from the power supply terminal 50 through the actuator 120, the FET 141, and the resistor R5 to the ground potential point is a current path through which a current is supplied to the actuator 120. The FET 141 and the operational amplifier 142 form a constant current circuit. The ground potential point is an exemplary reference potential point.

The operational amplifier 142 has a non-inverting input terminal, at which the reference signal from the controller 150 (see FIGS. 2 and 3) is received, the inverting input terminal, which is connected to the source terminal of the FET 141 through the resistor R4, and an output terminal, which is connected to the gate terminal of the FET 141 through the resistor R2. The resistor R2 is an exemplary first resistor. The line connecting the output terminal of the operational amplifier 142 to the gate terminal of the FET 141 is the signal transmission path 144 through which a drive control signal, which is described below, is transmitted.

The resistor R2 is disposed to limit the current value of a rush current, flowing from the output terminal of the operational amplifier 142 through the signal transmission path 144, and to protect the operational amplifier 142. The resistor R1 is connected as a negative feedback resistance between the inverting input terminal and the output terminal of the operational amplifier 142.

Two branch lines are connected between the signal transmission path 144 and the ground potential point. The resistor R3 has been inserted in series to one of the branch lines; the resistor R6 and the transistor 143 are connected on the other branch line. The resistor R6 is an exemplary second resistor. The resistor R6 is connected, at its first end, to the signal transmission path 144, and is connected, at its second end, to the collector terminal of the transistor 143. The collector terminal of the transistor 143 is an exemplary current input terminal. The emitter terminal of the transistor 143 is grounded; the base terminal receives a base control signal from the controller 150.

The resistor R3 has a function of setting the voltage, which is applied to the gate terminal of the FET 141, so as to prevent the FET 141 from being switched on unintentionally due to noise or the like. The resistor R6 has a function of setting the potential of the signal transmission path 144 (the potential of the gate terminal of the FET 141) to the voltage, at which the FET 141 is switched off, when the transistor 143 is on. The resistor R6 has a function of protecting the transistor 143 by limiting the value of a current flowing between the collector and the emitter of the transistor 143 when the transistor 143, which is switched on when the FET 141 is to be switched off, causes the charge of the gate-source parasitic capacitance Cgs of the FET 141 to be discharged.

The inverting input terminal receives a load signal obtained by converting, at the resistor R5 into a voltage, a current which flows through the current path between the actuator 120 and the resistor R5. The reference signal received at the non-inverting input terminal from the controller 150 (see FIGS. 2 and 3) is a signal which serves as the reference for operations of the FET 141. The operational amplifier 142 outputs, to the gate terminal of the FET 141, the drive control signal which is based on the comparison result between the reference signal and the load signal received at the inverting input terminal. The signal level of the drive control signal is the signal level at the gate terminal of the FET 141, and is the signal level in a portion, which is closer to the gate terminal than the resistor R2, of the signal transmission path 144.

In this drive control circuit 140A, the transistor 143 is disposed to control the voltage of the gate terminal of the FET 141 and to improve the ON/OFF responsiveness of the FET 141. The ON/OFF responsiveness of the FET 141 is to be improved to enhance the response performance of the actuator 120 in the tactile-sensation generation device 100A and to provide a crisp tactile clicking sensation (tactile sensation) to a user's fingertip. The transistor 143 is under on/off control using the base control signal. When the FET 141 is to be switched on, the transistor 143 is switched off; when the FET 141 is to be switched off, the transistor 143 is switched on. The base control signal is a signal for controlling the voltage of the gate terminal of the FET 141 through switching on/off the transistor 143.

When the FET 141 is to be switched off, the transistor 143 is switched on. Thus, the signal transmission path 144 is connected to the ground potential point through the resistor R6 and the transistor 143. In addition, the charge at the gate terminal of the FET 141 is discharged to the ground potential point through the signal transmission path 144, resulting in an immediate switch-off of the FET 141. The transistor 143, which operates as described above, is used to improve the OFF responsiveness of the FET 141. When the signal transmission path 144h is connected to the ground potential point through the resistor R6 and the transistor 143, the signal level of the drive control signal decreases to a value, corresponding to the value of a current flowing through the resistor R6, to be lower than the output voltage of the operational amplifier 142. That is, when the FET 141 is to be switched off, the transistor 143 is switched on. Thus, the drive control signal having a voltage level lower than the output voltage of the operational amplifier 142 is supplied to the gate terminal of the FET 141.

The resistance value of the resistor R6 is set lower than the resistance value of the resistor R2 so that the FET 141 is switched off without fail even when the operational amplifier 142 outputs an output voltage of the maximum voltage (5 V).

When the FET 141 is to be switched on, the transistor 143 is switched off. Thus, the drive control signal based on the output voltage of the operational amplifier 142 is received at the gate terminal of the FET 141. Just before the FET 141 is switched on, the transistor 143 is on, and the FET 141 is off. In addition, the output voltage of the operational amplifier 142 is the maximum voltage (5 V). Thus, at the moment when the transistor 143 is switched off, the maximum voltage of the operational amplifier 142 is applied to the gate-source voltage Vgs of the FET 141, and a rush (rush voltage) occurs, resulting in an immediate switch-on of the FET 141. The transistor 143, which operates as described above, is used to improve the ON responsiveness of the FET 141. When the FET 141 is to be switched on, the transistor 143 is switched off. Thus, the drive control signal having a voltage level based on the output voltage of the operational amplifier 142 is supplied to the gate of the FET 141. The voltage level of the drive control signal at that time is a voltage level obtained after output from the operational amplifier 142 through the resistor R2.

The reason why, in the state in which the transistor 143 is on and the FET 141 is off, the output voltage of the operational amplifier 142 is maintained at the maximum voltage will be described below.

Operations in the Tactile-Sensation Generation Device 100A

Figure 5:
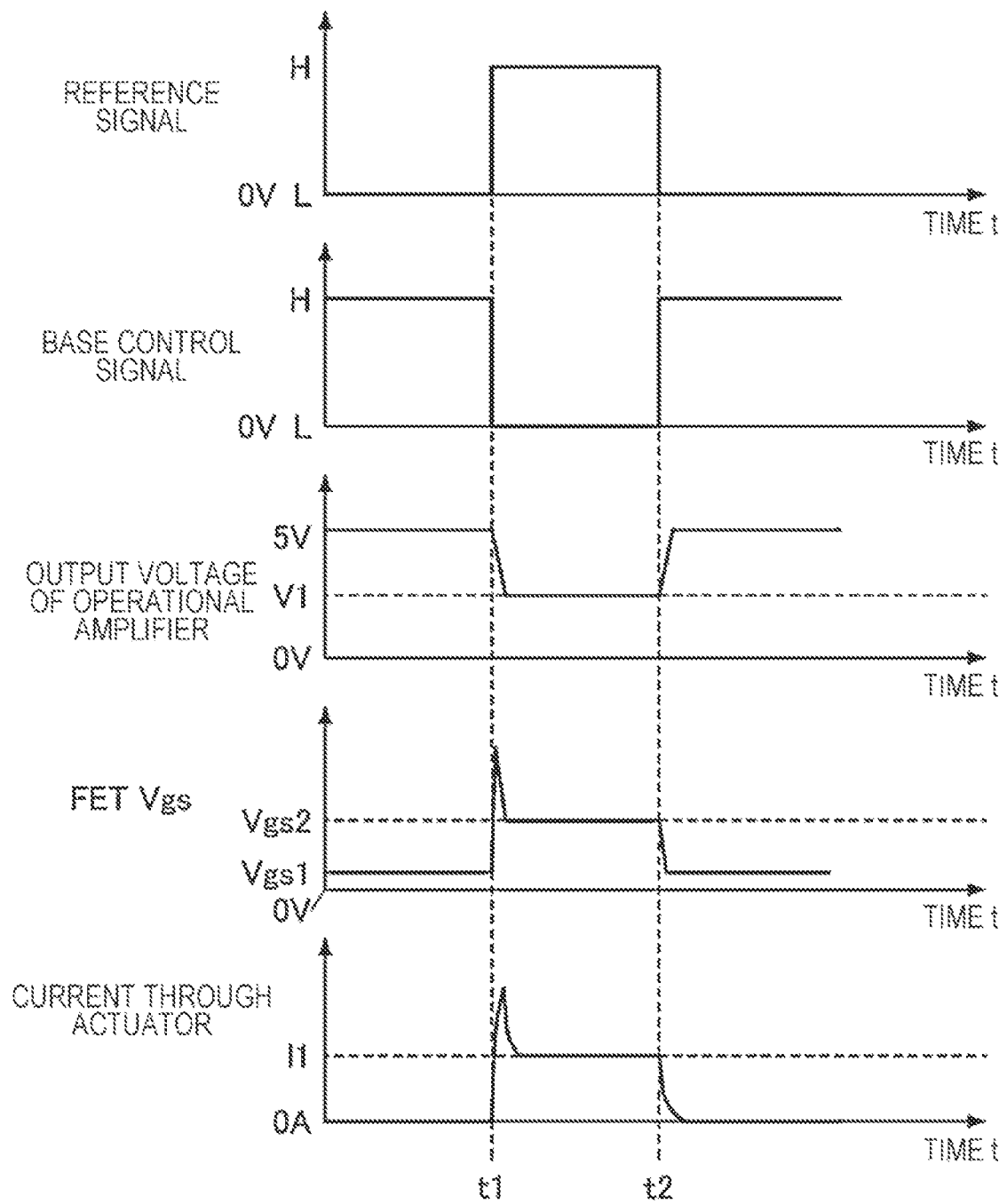
FIG. 5 is a diagram for describing operations in the tactile-sensation generation device.

FIG. 5 is a diagram for describing operations in the tactile-sensation generation device 100A. In FIG. 5, the horizontal axis represents time t. FIG. 5 illustrates an example of the reference signal (the vertical axis represents voltage value), the base control signal (the vertical axis represents voltage value), the output voltage of the operational amplifier 142 (the vertical axis represents voltage value), the gate-source voltage Vgs of the FET 141 (the vertical axis represents voltage value), and the waveform of a current through the actuator 120 (the vertical axis represents current value). The output voltage of the operational amplifier 142 represents the voltage level at the output terminal of the operational amplifier 142, and is an exemplary output level of the drive circuit. The signal level of the drive control signal is the signal level at the gate terminal of the FET 141, and thus corresponds to the gate-source voltage Vgs of the FET 141.

In the initial state before time t1, the reference signal has not risen (L (low) level); the base control signal is at the H (High) level, and the transistor 143 is on. The output voltage of the operational amplifier 142 is 5 V (maximum value). However, since the transistor 143 is on, the gate-source voltage Vgs of the FET 141 is Vgs1, and the FET 141 is off. Thus, no current flows through the actuator 120. Switching on the transistor 143 causes the charge of the gate-source parasitic capacitance Cgs to be discharged through the signal transmission path 144.

The output voltage of the operational amplifier 142 is 5 V. However, since the transistor 143 is on, the gate-source voltage Vgs of the FET 141 decreases to Vgs1. That is, the signal level of the drive control signal decreases to a first level at which the FET 141 is switched off. Vgs1 is a voltage at which the FET 141 is switched off, and is, for example, a voltage of about 1 V or less. The output voltage of the operational amplifier 142 is 5 V (maximum value) in the following manner. Switching on the transistor 143 causes the voltage at the gate terminal of the FET 141 to decrease, resulting in a switch-off of the FET 141. This causes the voltage at the source terminal of the FET 141 to be 0 V which is negatively fed back to the inverting input terminal of the operational amplifier 142 through the resistor R4. The operational amplifier 142 has an offset voltage which is present between the non-inverting input terminal and the inverting input terminal. Thus, 0 V applied to the inverting input terminal increases the output voltage. However, the transistor 143 is on; the FET 141 is off; 0 V is continuously applied to the inverting input terminal. Thus, 5 V, which is the maximum output voltage, is output.

In the initial state before time t1, even when the reference signal has risen to the H level, the operations are the same. In this case, regardless of whether the FET 141 is on/off, the reference signal is maintained at the H level.

At time t1, the reference signal rises to the H level; the base control signal falls to the L level, and the transistor 143 is switched off. The output voltage of the operational amplifier 142 reaches V1. Since the transistor 143 is off, the gate-source voltage Vgs of the FET 141 increases. Thus, a rush current momentarily flows from the output terminal of the operational amplifier 142 through the signal transmission path 144 to the gate terminal of the FET 141.

The rush current, which flows from the output terminal to the operational amplifier 142 to the gate terminal of the FET 141, causes the gate-source parasitic capacitance Cgs of the FET 141 to be charged immediately, resulting in an immediate switch-on of the FET 141. At that time, the gate-source voltage Vgs increases to Vgs2 higher than Vgs1. The gate-source voltage Vgs2 is a voltage which is sufficient to switch on the FET 141. Since the gate-source voltage increases to Vgs2, the signal level of the drive control signal has increased to a second level at which the FET 141 is switched on.

A momentary rush occurs in the gate-source voltage Vgs of the FET 141 at time t1. Thus, a rush current also occurs in the current flowing through the actuator 120. As a result, the actuator 120 is driven at time t1 immediately. At time t2, the reference signal falls to the L level;

the base control signal rises to the H level, and the transistor 143 is switched on. The output voltage of the operational amplifier 142 reaches 5 V. However, since the transistor 143 is on, the gate-source voltage Vgs of the FET 141 immediately decreases to Vgs1. Switching on the transistor 143 causes the charge of the gate-source parasitic capacitance Cgs to be discharged through the signal transmission path 144. Thus, the gate-source voltage Vgs of the FET 141 immediately decreases to Vgs1, and the FET 141 is switched off. The signal level of the drive control signal at that time has decreased to the first level at which the FET 141 is switched off.

When the FET 141 is switched off at time t2, the current through the actuator 120 reaches 0 (A), and the actuator 120 immediately stops at time t2.

Thus, the transistor 143 is disposed on the branch line which branches from the signal transmission path 144 to the ground potential point. When the FET 141 is to be switched off, the transistor 143 is switched on. Thus, the charge of the gate-source parasitic capacitance Cgs is discharged from the signal transmission path 144 through the transistor 143, achieving immediate switch-off of the FET 141.

When the FET 141 is to be switched on, the transistor 143 is switched off. This causes a rush to occur in the gate-source voltage Vgs of the FET 141. Thus, the gate-source parasitic capacitance Cgs of the FET 141 is charged immediately, and the gate-source voltage Vgs increases immediately, achieving immediate switch-on of the FET 141.

The Configuration and Operations of a Drive Control Circuit 10A for Comparison

Figure 6:
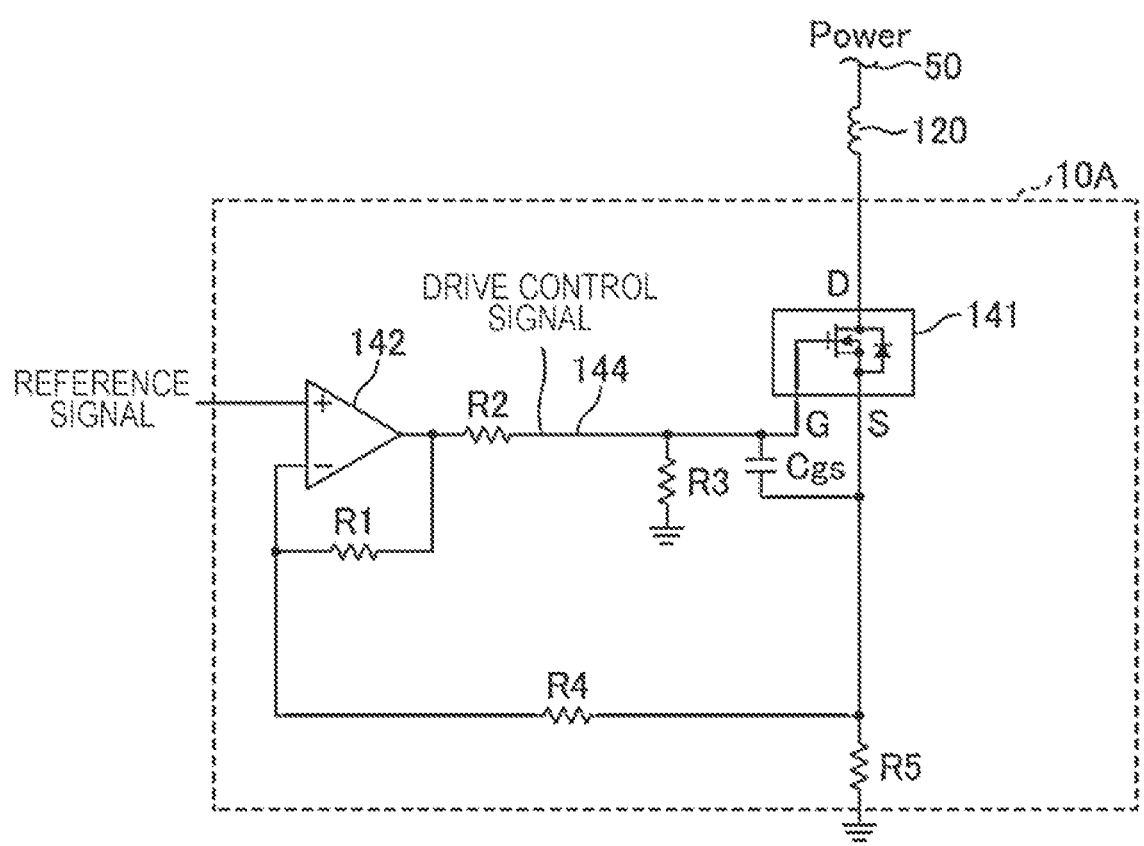
FIG. 6 is a diagram illustrating the configuration of a drive control circuit for comparison.

FIG. 6 is a diagram illustrating the configuration of a drive control circuit 10A for comparison. The drive control circuit 10A includes the FET 141, the operational amplifier 142, the signal transmission path 144, and the resistors R1 to R5. The drive control circuit 10A for comparison has a configuration of that of the drive control circuit 140A, which is illustrated in FIG. 4, minus the transistor 143 and the resistor R6. The drain terminal of the FET 141 of the drive control circuit 10A for comparison is connected to the actuator 120. The drive control circuit 10A for comparison is a circuit illustrated for comparison, not a circuit of the related art.

FIG. 7 is a diagram illustrating operations in the drive control circuit 10A for comparison. In FIG. 7, the horizontal axis represents time t. FIG. 7 illustrates an example of the reference signal (the vertical axis represents voltage value), the output voltage of the operational amplifier 142 (the vertical axis represents voltage value), the gate-source voltage Vgs of the FET 141 (the vertical axis represents voltage value), and the waveform of a current through the actuator 120 (the vertical axis represents current value).

In the initial state before time t1, the reference signal has not risen (L level). In the drive control circuit 10A for comparison, the reference signal is switched between the H level and the L level so that the FET 141 is on/off controlled. Thus, the reference signal is at the L level, and the FET 141 is off.

When the reference signal is at the L level and the FET 141 is off, the voltage value of the load signal received at the inverting input terminal through the resistor R4 indicates a low voltage close to 0 V. Thus, the output voltage of the operational amplifier 142 is a low voltage close to 0 V. This configuration is different from the configuration, in which 5 V is output, in FIG. 5 in that the output voltage of the operational amplifier 142 is a low voltage close to 0 V.

At time t1, when the reference signal rises to the H level, the output voltage of the operational amplifier 142 rises to V1. However, when the reference signal is switched, since the output voltage of the operational amplifier 142 is maintained at a low voltage close to 0 V, a rush, which enables the gate-source parasitic capacitance Cgs of the FET 141 to be charged momentarily, fails to be applied. Thus, it takes time to charge the parasitic capacitance Cgs. Compared with the operations illustrated in FIG. 5, it takes time for the output voltage of the operational amplifier 142 to rise to V1.

As a result, the gate-source voltage Vgs of the FET 141 reaches Vgs2 more slowly than the operation in FIG. 5. The actuator 120 is driven later than the operation in FIG. 5.

At time t2, when the reference signal falls to the L level, the charge of the gate-source parasitic capacitance Cgs of the FET 141 is discharged in such a manner that the operational amplifier 142 draws the charge through the resistor R2. Thus, the discharge time is longer than that of the discharge through the resistor R6 having a resistance value lower than that of the resistor R2 as illustrated in FIG. 5. As a result, compared with FIG. 5, the output voltage of the operational amplifier 142 slowly reaches a low voltage close to 0 V as in the initial state. The gate-source voltage Vgs of the FET 141 decreases to a low voltage close to 0 V slowly, and the FET 141 is switched off later than the operation in FIG. 5. Thus, the current through the actuator 120 becomes a low current close to 0 (A) later than the operation in FIG. 5, and the actuator 120 stops later than the operation in FIG. 5.

Thus, in the drive control circuit 10A for comparison which does not include the transistor 143 and the resistor R6, the ON/OFF responsiveness of the FET 141 is worse than that of the drive control circuit 140A according to the embodiment. This is due to the influence from the gate-source parasitic capacitance Cgs and the like.

As described above, the transistor 143 is disposed on a branch line which branches from the signal transmission path 144 to the ground potential point. When the FET 141 is to be switched off, the transistor 143 is switched on, and the drive control signal is set to the first level. In addition, when the FET 141 is to be switched on, the transistor 143 is switched off, and the drive control signal is set to the second level. This enables the FET 141 to be switched between on and off immediately.

Therefore, the electronic device and the tactile-sensation generation device 100A having good responsiveness may be provided. When the load connected to the drain terminal of the FET 141 is an inductive load such as the actuator 120, the responsiveness of the FET 141 is affected compared with the case in which the load is not inductive. In this case, the present disclosure is particularly effective. Therefore, in the tactile-sensation generation device 100A, the response performance of the actuator 120 is high, enabling a crisp tactile clicking sensation (tactile sensation) to be provided to a user's fingertip.

The transistor 143 is a switching element that is disposed on the branch line which branches from the signal transmission path 144 and which is connected to the ground potential point, and that switches the connection state between the signal transmission path 144 and the ground potential point. The signal transmission path 144 extends between the output terminal, from which the operational amplifier 142 outputs the drive control signal to the FET 141, and the gate terminal of the FET 141, which is connected to the output terminal and which receives the drive control signal. The transistor 143, which is switched on, causes the signal level of the drive control signal to be at the first level; the transistor 143, which is switched off, causes the signal level of the drive control signal to be at the second level. Therefore, switching on the transistor 143 enables the signal level of the drive control signal to decrease to the first level without fail, achieving immediate switch-off of the FET 141 without fail.

In addition, the resistor R2, which has been inserted between the branch point at which branching from the signal transmission path 144 to the ground potential point is made and the output terminal of the operational amplifier 142, is further included. The current value of a rush current flowing from the output terminal of the operational amplifier 142 through the signal transmission path 144 is limited, enabling protection of the operational amplifier 142.

In addition, the resistor R6, which has been inserted between the branch point at which branching from the signal transmission path 144 to the ground potential point is made and the current input terminal of the transistor 143, is further included. Thus, when the transistor 143, which is switched on when the FET 141 is to be switched off, causes the charge of the gate-source parasitic capacitance Cgs of the FET 141 to be discharged, the value of a current flowing between the collector and the emitter of the transistor 143 is limited, enabling protection of the transistor 143.

In the state in which the transistor 143 is on, the output level of the operational amplifier 142 is higher than the second level. This enables a rush current of the drive control signal to be supplied to the gate terminal of the FET 141 more reliably.

When, from the state in which the transistor 143 is switched on and the signal level of the drive control signal is at the first level, the transistor 143 is switched off and the signal level of the drive control signal reaches the second level, a rush current of the drive control signal is supplied to the gate terminal of the FET 141 from the operational amplifier 142, enabling immediate switch-on of the FET 141 and more reliable improvement of the responsiveness of the FET 141.

The electronic device and the tactile-sensation generation device according to the exemplary embodiment of the present disclosure are described above. The present disclosure is not limited to the embodiment which is specifically disclosed. Various modifications and changes may be made without departing from the scope of the claims.

What is claimed is:

1. An electronic device comprising:
   a load;
   a first switching element that is disposed on a current path connected to the load;
   a drive circuit that drives the first switching element by using a drive control signal, the drive control signal being based on a comparison result between a load signal and a reference signal, the load signal being obtained by converting, into a voltage, a current flowing through the current path, the reference signal serving as a reference of an operation of the first switching element; and
   a second switching element that is capable of switching a signal level of the drive control signal between a first level and a second level, the first level being a level at which the first switching element is switched off, the second level being a level at which the first switching element is switched on,
   wherein the second switching element is a switching element that is disposed on a branch line and that switches a connection state between a signal transmission path and a reference potential point, the branch line branching from the signal transmission path and being connected to the reference potential point, the signal transmission path being a path between an output terminal and a control terminal of the first switching element, the output terminal being a terminal from which the drive circuit outputs the drive control signal to the first switching element, the control terminal of the first switching element being connected to the output terminal and receiving the drive control signal,
   when the second switching element is switched on, the signal level of the drive control signal becomes the first level, and
   when the second switching element is switched off, the signal level of the drive control signal becomes the second level.

2. The electronic device according to claim 1, further comprising:
   a first resistor that has been inserted between a branch point and the output terminal of the drive circuit, the branch point being a point at which branching from the signal transmission path to the reference potential point is made.

3. The electronic device according to claim 1, further comprising:
   a second resistor that has been inserted between a branch point and a current input terminal of the second switching element, the branch point being a point at which branching from the signal transmission path to the reference potential point is made.

4. The electronic device according to claim 1,
   wherein an output level of the drive circuit is higher than the second level in a state in which the second switching element is on.

5. A tactile-sensation generation device comprising:
   an actuator that generates a vibration;
   a first switching element that is disposed on a current path connected to the actuator;
   a drive circuit that drives the first switching element by using a drive control signal, the drive control signal being based on a comparison result between a load signal and a reference signal, the load signal being obtained by converting, into a voltage, a current flowing through the current path, the reference signal serving as a reference of an operation of the first switching element; and
   a second switching element that is capable of switching a signal level of the drive control signal between a first level and a second level, the first level being a level at which the first switching element is switched off, the second level being a level at which the first switching element is switched on,
   wherein, when the second switching element is switched off and the signal level of the drive control signal reaches the second level from a state in which the second switching element is switched on and the signal level of the drive control signal is at the first level, a rush current of the drive control signal is supplied to a control terminal of the first switching element from the drive circuit.

* * * * *